(12) United States Patent
Classen et al.

(10) Patent No.: US 9,926,188 B2
(45) Date of Patent: Mar. 27, 2018

(54) SENSOR UNIT INCLUDING A DECOUPLING STRUCTURE AND MANUFACTURING METHOD THEREFOR

(71) Applicant: Robert Bosch GmbH, Stuttgart (DE)

(72) Inventors: Johannes Classen, Reutlingen (DE); Torsten Kramer, Wannweil (DE); Hubert Benzel, Pliezhausen (DE); Jens Frey, Filderstadt (DE); Daniel Christoph Meisel, Pittsburgh, PA (US); Christoph Schelling, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/119,917

(22) PCT Filed: Feb. 5, 2015

(86) PCT No.: PCT/EP2015/052370
§ 371 (c)(1),
(2) Date: Aug. 18, 2016

(87) PCT Pub. No.: WO2015/124432
PCT Pub. Date: Aug. 27, 2015

(65) Prior Publication Data
US 2017/0203958 A1     Jul. 20, 2017

(30) Foreign Application Priority Data

Feb. 18, 2014  (DE) .................. 10 2014 202 915
May 26, 2014  (DE) .................. 10 2014 210 006

(51) Int. Cl.
*H01L 23/498*     (2006.01)
*B81B 7/00*       (2006.01)
*B81C 3/00*       (2006.01)

(52) U.S. Cl.
CPC ............ *B81B 7/0048* (2013.01); *B81C 3/001* (2013.01); *B81B 2201/0264* (2013.01);
(Continued)

(58) Field of Classification Search
CPC .................. B81B 7/0048; B81B 7/007; B81B 2203/0315; B81B 2203/036; B81B 2201/0264
See application file for complete search history.

(56) References Cited

U.S. PATENT DOCUMENTS

2003/0222337 A1   12/2003   Stewart et al.
2008/0290430 A1   11/2008   Mahadevan et al.
(Continued)

FOREIGN PATENT DOCUMENTS

CN    102608355 A     7/2012
CN    103508408 A     1/2014
WO    2012037536 A2   3/2012

OTHER PUBLICATIONS

International Search Report for PCT/EP2015/052370, dated Jul. 14, 2015.

*Primary Examiner* — Whitney T Moore
*Assistant Examiner* — Joseph Galvin, III
(74) *Attorney, Agent, or Firm* — Norton Rose Fulbright US LLP; Gerard Messina (57) ABSTRACT

A sensor unit including a first semiconductor component and a second semiconductor component, the first semiconductor component including a first substrate and a sensor structure. The second semiconductor component includes a second substrate, the first and second semiconductor components being connected to each other with the aid of a wafer connection, the sensor unit having a decoupling structure,
(Continued)

which is configured in such a way that the sensor structure is decoupled thermally and/or mechanically from the second semiconductor component.

29 Claims, 11 Drawing Sheets

(52) U.S. Cl.
CPC . *B81B 2203/0127* (2013.01); *B81C 2201/019* (2013.01); *B81C 2201/0132* (2013.01)

(56) References Cited

U.S. PATENT DOCUMENTS

| | | | |
|---|---|---|---|
| 2011/0133315 A1* | 6/2011 | Pahl | B81B 7/0048 257/659 |
| 2013/0000411 A1* | 1/2013 | Robert | G01L 9/0052 73/708 |
| 2014/0239424 A1* | 8/2014 | Ding | B81C 1/00269 257/419 |
| 2015/0008542 A1* | 1/2015 | Kaelberer | H04R 19/04 257/416 |

* cited by examiner

SENSOR UNIT INCLUDING A DECOUPLING STRUCTURE AND MANUFACTURING METHOD THEREFOR

FIELD OF THE INVENTION

The present invention is directed to a sensor unit.

BACKGROUND INFORMATION

Such sensor units are generally known. For example, it is known to join two semiconductor components, which are formed of two different wafers, in a wafer bonding process, into a single sensor unit. For example, one semiconductor component includes a sensor structure and the second semiconductor component includes an integrated circuit. However, in such known sensor units, detection is comparatively strongly affected by outside interferences.

SUMMARY OF THE INVENTION

One object of the present invention is to provide a sensor unit in which the effect of external influences, for example, thermomechanical and/or mechanical stresses on a sensor structure of the sensor unit are reduced.

The sensor unit according to the present invention and the method according to the present invention for manufacturing a sensor unit according to the other independent claims have the advantage over the related art that a sensor unit is provided, in which transmission of thermomechanical and/or mechanical stresses from the second semiconductor component to the sensor structure is reduced in such a way that the detection properties of the sensor unit are improved. In particular, the sensor structure is decoupled from the second semiconductor component with respect to thermomechanical and/or mechanical stresses. In particular, the interferences transmitted via the wafer connection established between the two semiconductor components with the aid of the wafer bonding process are reduced. According to the present invention, the decoupling structure is configured in such a way that the sensor structure is thermomechanically and/or mechanically decoupled from the second semiconductor component. Decoupling means, in particular, that mechanical and/or thermomechanical stresses, for example, due to temperature changes or deformations of the second semiconductor component, are not transmitted to the sensor structure or are transmitted only to a negligible extent, i.e., with respect to a detection by the sensor unit. The sensor unit may include a third semiconductor component, for example, a circuit board, connected to the first or second semiconductor component via a component connection, the decoupling structure in this case being configured in such a way that the sensor structure is thermally and/or mechanically decoupled also from the third semiconductor component.

In particular, the sensor unit is integrated into a Wafer Level Chip Scale Package (WLCSP), i.e., in a package for semiconductor components, in particular, sensors, i.e., in a chip housing on the order of magnitude of a single semiconductor chip (die) separated from a wafer, for example, by sawing or breaking. Advantageously, the stress sensitivity, i.e., the sensitivity of the sensor unit to external interferences such as, for example, thermal and/or mechanical stresses, is reduced for the WLCSP according to the present invention.

In particular, the sensor unit is an inertial sensor unit and/or a pressure sensor unit. For example, the sensor unit is a barometer, an altimeter, an acceleration sensor, a rotation rate sensor, or a combination thereof for use in mobile telecommunication terminals, smart phones, or tablet PCs.

Advantageous embodiments and refinements of the present invention are provided in the subclaims and the description with reference to the drawings.

According to one refinement, the decoupling structure has a trench structure, the trench structure extending into the first substrate along the normal direction, perpendicular to the main extension plane of the first substrate, i.e., in particular not all the way through or all the way through the first substrate.

Thereby it is advantageously possible to achieve decoupling in a particularly efficient manner by achieving the rigidity of the first substrate by adapting a trench height and/or trench depth adjustably in a targeted manner in order to achieve the decoupling of the sensor structure from the second and/or third semiconductor component with respect to external interferences. In a particularly preferred manner, the decoupling structure has a trench structure, which contains one or more trenches surrounding the sensor structure in the first substrate. The sensor unit may have a microelectromechanical system (MEMS), in particular, the sensor structure is a MEMS sensor structure having a MEMS sensor element (MEMS core). The resulting thinner areas, i.e., areas of lesser extension of the first substrate (MEMS substrate) along the normal direction are capable of absorbing the deformation of the second semiconductor component, which has an integrated circuit, (ASIC), for example, and/or of the third semiconductor component, which has an application circuit board, for example, while the sensor element of the sensor structure remains virtually undeformed due to its comparatively great thickness and high rigidity. The stability of offset, sensitivity, and other MEMS sensor parameters is thus considerably improved relative to the related art.

According to another preferred refinement it is provided that the decoupling structure has coupling elements for coupling the sensor structure to a mainland structure of the first substrate.

It is thus advantageously possible to connect the sensor structure to the mainland structure, in particular, exclusively indirectly, via coupling elements, so that decoupling is achieved.

According to another refinement, the trench structure extends mainly in parallel to the main extension plane of the first substrate, the trench structure surrounding the sensor structure, the trench structure in particular, being of a meandering shape or frame shape, in particular, of a ring shape.

It is thus advantageously possible to achieve an efficient decoupling of the sensor structure. In particular, the decoupling structure has an additional trench structure. In particular, the additional trench structure or, according to an alternative specific embodiment, the trench structure, surrounds a contact area of the wafer connection and/or an additional contact area of the component connection with respect to a projection direction parallel to the normal direction. In particular, the additional trench structure is meander-shaped. In particular, the contact areas are solder bumps or bond pads.

As mentioned previously, the decoupling structure of the sensor unit according to the present invention is configured in such a way that the sensor structure is thermomechanically and/or mechanically decoupled from the second semiconductor component. A decoupling of this type is advantageous not only for the micromechanical sensor function of the first semiconductor component, but also for the function of the second semiconductor component, in particular, if this is an ASIC component.

The wafer connection between the semiconductor components of a sensor unit of the type being discussed here may be established with the aid of direct silicon bonding or eutectic bonding. In these bonding methods, the two wafers to be bonded are pressed against each other at an elevated temperature. The wafer bows and surface roughnesses are smoothed out by a relatively high contact pressure. Since this contact pressure is introduced into the components to be bonded only via the bond contact points, the bonding process results in an uneven pressure load on the individual chip areas. This is problematic, in particular, for an ASIC component. During the ASIC processing, the material of the dielectric insulation layers of the ASIC layer structure is optimized for a preferably low dielectric constant in order to minimize the RC delays in the strip conductors of the wiring levels. Since the dielectric constant is the smaller the more porous the dielectric material is, mechanically fragile materials are increasingly used for the insulation layers of the ASIC layer structure. Therefore, there is the risk that the functional elements of the ASIC component become damaged during the bonding process due to the low mechanical stability of the individual layers of the ASIC layer structure.

Therefore, in a particularly advantageous specific embodiment of the present invention, the decoupling structure includes at least one diaphragm element, which spans a cavity in the layer structure of the first semiconductor component and is formed in the area above the wafer connection. The cavity underneath the diaphragm element may be closed, but it may also be connected to the surroundings via pressure equalization openings. With the aid of such a diaphragm element over a cavity in the layer structure of the MEMS semiconductor component, the high contact pressure required for bonding processes may be locally limited to the bond frame, i.e., the bonding area without the sensitive circuit elements of an ASIC component being thereby damaged. The deflection or deformation of the diaphragm element during the bonding process prevents the pressure force from being transmitted to the vicinity of the bond frame. In this way diaphragm element and cavity contribute to the mechanical decoupling of the bonding area from neighboring chip areas of the sensor unit according to the present invention.

The diaphragm elements in the bonding area also make a uniform distribution of the pressure force during the bonding process possible and are responsible for smoothing the topography, so that the occurrence of local excess forces is avoided.

According to a further refinement it is provided that the sensor structure has a structure element surrounded by the first substrate and a sensor element surrounded by a function layer of the first semiconductor component, the sensor element being connected to the first substrate exclusively indirectly via the coupling elements, in particular, the coupling elements being formed from the first substrate and/or from the function layer.

According to a further refinement it is provided that the sensor unit has a cavity and/or a separate further cavity, the cavity and/or the further cavity being situated between the first and the second semiconductor components, the wafer connection having a bond frame structure surrounding the cavity and/or the further cavity, the bond frame structure being configured in such a way that the cavity and/or the separate further cavity is/are hermetically sealable or sealed, the ventilation duct, in particular, extending through the first substrate to the cavity or further cavity.

This makes it advantageously possible to decouple a sensor structure including a sensor element situated in a cavity from external interferences. In particular, it is also possible to implement, in a particularly efficient manner, two decoupled sensor structures in the sensor unit, one sensor structure being assigned to one cavity.

According to a further refinement it is provided that the sensor structure is a pressure sensor structure, a pressure sensor channel being situated in the first substrate, the pressure sensor channel extending into the sensor unit to a diaphragm of the pressure sensor structure.

This makes it advantageously possible to provide a pressure sensor, the structure of the pressure sensor being decoupled from mechanical and/or thermomechanical stresses of the second and/or third semiconductor component.

According to a further refinement it is provided that the sensor unit has a via formed in the first substrate, in particular, a silicon via for electrically contacting the sensor element of the sensor structure.

This makes it advantageously possible to provide a comparatively compact sensor unit, in which, however, the influence of thermal and/or mechanical stresses on detection is comparatively small.

According to another preferred refinement it is provided that the decoupling structure is a trench structure filled with a filling material, the filling material being a polymer material in particular, the filling material having a shear modulus at least one order of magnitude smaller than a substrate material, in particular, silicon material, of the first substrate.

This makes it advantageously possible to protect the sensor structure against contamination.

According to one preferred refinement of the method according to the present invention it is provided that in the third manufacturing step
  the decoupling structure and/or
  a pressure sensor channel and/or
  a via hole and/or
  a ventilation duct and/or
  an insulation structure
are structured in the first semiconductor component, in particular, in the first substrate, with the aid of time-controlled etching, in particular, reactive ion deep etching and/or with the aid of a laser beam.

This makes it advantageously possible to form the decoupling structure and/or the pressure sensor channel and/or the via hole and/or the ventilation duct and/or the insulation structure in the first substrate in a comparatively simple manner.

According to another refinement of the method according to the present invention it is provided that in the third manufacturing step,
  the decoupling structure and/or
  the pressure sensor channel and/or
  the via hole and/or
  the ventilation duct and/or
  the insulation structure
are formed simultaneously in the first semiconductor component, in particular, in the first substrate.

This makes it advantageously possible to manufacture the sensor unit including a decoupled sensor structure at a comparatively low extra cost. By forming the different structures of the different systems simultaneously, an improvement of the stress sensitivity is achieved at almost no extra process costs.

According to one specific embodiment of the present invention, the sensor unit is configured for pressure measurement, the sensor structure being a pressure sensor structure and the second semiconductor component having an evaluation structure configured, in particular, as an integrated circuit (ASIC). In particular, the first semiconductor component (sensor chip) is mounted on the second semiconductor component (evaluation ASIC) with the aid of flip-chip (FC) technology. In particular, the second semiconductor component connected to the first semiconductor component is mounted on the third semiconductor component (circuit board) with the aid of FC technology. The decoupling structure preferably has a trench structure including one or multiple trenches, which are grooves for stress decoupling, for example. Additionally, the decoupling structure has, in particular, double bridge elements and/or diaphragm elements, in particular, Por-Si diaphragm elements. In particular, the diaphragm elements are situated underneath the contact areas along a projection direction parallel to the normal direction of the first substrate.

Exemplary embodiments of the present invention are depicted in the drawings and elucidated in greater detail in the description that follows.

DETAILED DESCRIPTION

Figure 1:
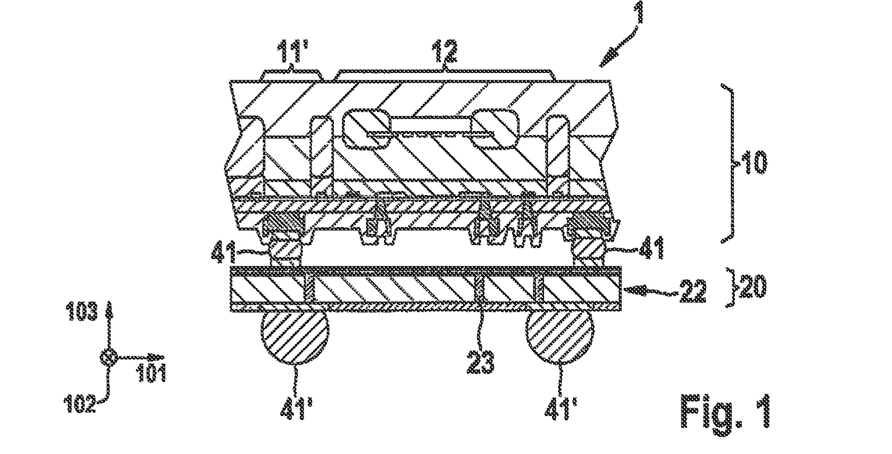
FIGS. 1 through 22 show sensor units according to different specific embodiments of the present invention.

FIG. 1 shows a sensor unit 1, which is configured as a pressure sensor, sensor unit 1 having a first semiconductor component 10, which is attached to a second semiconductor component 20 with the aid of flip-chip technology. Here, first semiconductor component 10 has a sensor structure 12 and second semiconductor component 20 has an evaluating structure 22, in particular, an integrated circuit (ASIC). First and second semiconductor components 10, 20 are here mechanically and electrically conductively connected to each other via a contact area 41. Evaluating structure 22 here has a via 23, which is referred to as a via or a silicon via. In particular, via 23 is configured in such a way that an output signal of sensor structure 12 is conducted to a backside (in the drawing the bottom side) of sensor unit 1. Second semiconductor component 20 connected to first semiconductor component 10 via a further contact area 41' may be soldered on a third semiconductor component 30 (for example, onto a circuit board of a circuit as shown in FIG. 3).

Figure 2:
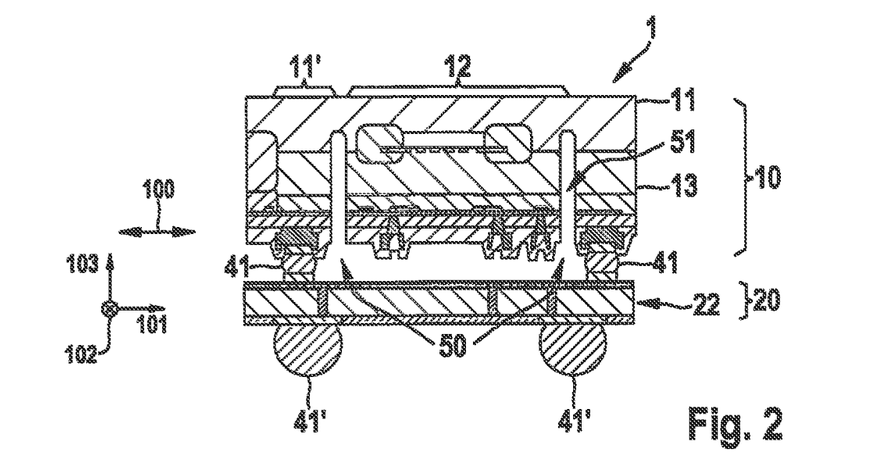

FIG. 2 shows a sensor unit 1 according to one specific embodiment of the present invention. The specific embodiment depicted here essentially corresponds, in particular, to the specific embodiment depicted in FIG. 1. First semiconductor component here also has a decoupling structure 50 according to the present invention for voltage decoupling. Decoupling structure 50 here has a trench structure 51, in particular, a groove. Here trench structure 51 surrounds sensor structure 12 in a plane, which is parallel to main extension plane 100 of a first substrate 11 of first semiconductor component 10. A first direction 101, parallel to main extension plane 100 is identified here as X direction; a second direction 102 parallel to main extension plane 100 and perpendicular to the X direction is identified here as Y direction. In particular, decoupling structure 50 is configured here in such a way that thermomechanical and/or mechanical surface stresses, which are transmitted, for example, via further contact areas 41' from third semiconductor component 30 (see FIG. 3) to second semiconductor component 20 and/or via contact areas 41 from second semiconductor component 20 to first semiconductor component 10, are not directly transmitted to sensor structure 12. This means, that sensor structure 12 is largely decoupled from second and/or third semiconductor component(s) 20, 30, regarding thermomechanical and/or mechanical stresses. Optionally, the grooves of trench structure 51 extend along normal direction 103 into first semiconductor component 10, i.e., not all the way through it, or all the way through first substrate 11 and/or a function layer 13 of first semiconductor component 10.

Figure 3:
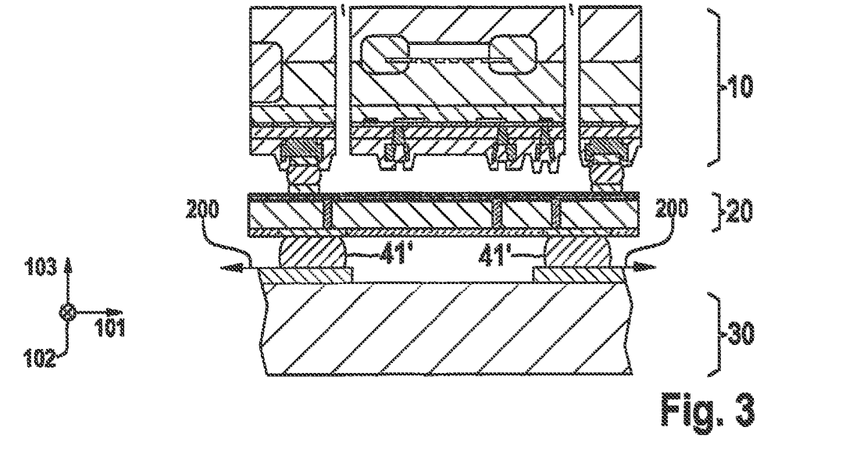
Figure 5:
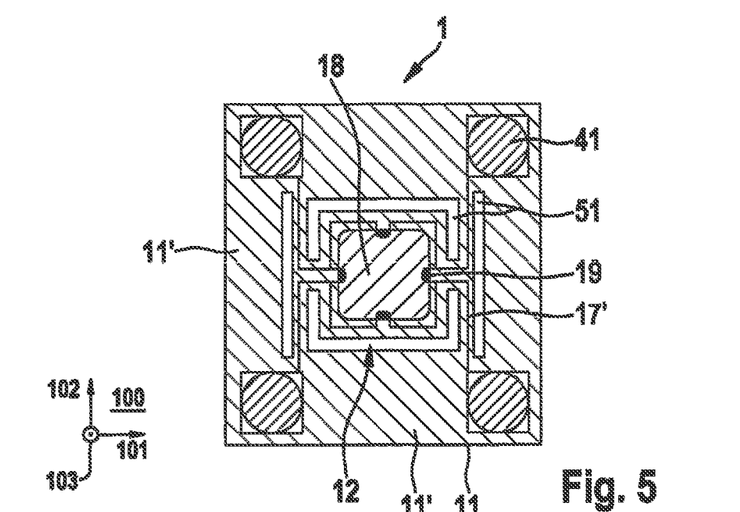
Figure 6:
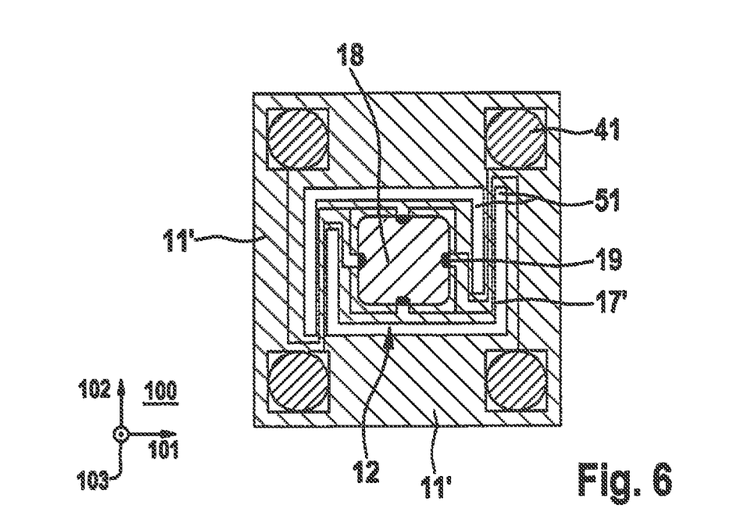

FIG. 3 shows a sensor unit 1 according to one specific embodiment of the present invention, second semiconductor component 20 being attached to third semiconductor component 30, in particular, a circuit board 30. In particular, circuit board 30 here has a temperature expansion coefficient which is, in particular, one or more orders of magnitude greater than a temperature expansion coefficient of silicon. Shear forces (see arrows 200), for example, resulting in mechanical stresses in the first and/or second semiconductor component(s) 10, 20, may be generated on further contact areas 41', here bond pads, via temperature changes. A trench of trench structure 51, which is also referred to as stress decoupling trench 51, extends through the entire first semiconductor component 10. FIGS. 5 and 6 show specific embodiments of this sensor unit 1 in top view, as an example.

Figure 4:
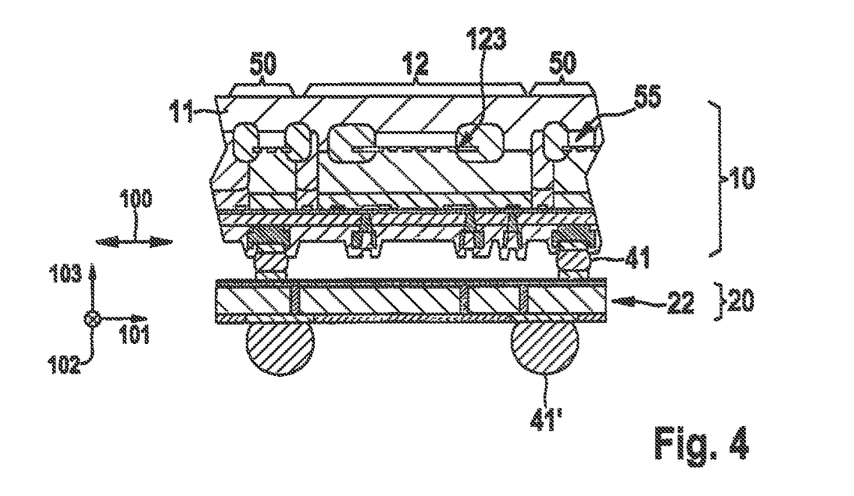

FIG. 4 shows a sensor unit 1 according to one specific embodiment of the present invention, which essentially corresponds to the specific embodiments depicted in FIGS. 2 and 3, decoupling structure 50 of sensor unit 1 here having additional diaphragm elements 55, in particular, diaphragms made of porous silicon (PorSi). In particular, diaphragm elements 55 fully or partially overlap along a projection direction parallel to normal direction 103, with contact areas 41 and/or further contact areas 41', so that the thermally and/or mechanically induced stresses may be relieved outside sensor structure 12, in particular, outside a pressure sensor diaphragm 123 of sensor structure 12. In particular, diaphragm elements 55 protrude beyond an extension of contact areas 41 along a first direction 101 parallel to main extension plane 100 of first substrate 11.

FIG. 5 shows a sensor unit 1 according to one specific embodiment of the present invention in a schematic top view, which essentially corresponds to the specific embodiments depicted in FIGS. 2 through 4, trench structure 51 here surrounding sensor structure 12. Sensor structure 12 here is a pressure sensor structure 12 including a pressure sensor diaphragm 18 and a piezoelectric resistor 19. Trench structure 51 here has a meander shape and, in particular, does not follow a closed path around sensor structure 12. Furthermore, sensor unit 1 has a strip conductor structure 17', which is provided for electrical contacting of sensor structure 12. In particular, strip conductors of strip conductor structure 17' run between the grooves or trenches of trench structure 51. Pressure sensor diaphragm 18 is here suspended spring-elastically on a mainland structure 11' of first semiconductor component 10. This makes it advantageously possible to decouple sensor structure 12 from mechanical stresses imposed from the outside, so that no, or almost no, mechanical stresses are transmitted to sensor structure 12.

Particularly preferred, trench structure 12 extends parallel to main extension plane 100 along the entire first substrate 11.

FIG. 6 shows a sensor unit 1 according to one specific embodiment of the present invention in a schematic top view, which essentially corresponds to the specific embodiments depicted in FIGS. 2 through 5, sensor structure 12 here being connected to mainland structure 11' not centrally, but at offset points. In this way, effective attachment springs are created here in first substrate 11, on which strip conductors 17' run to the outside and which suppress the assembly stress.

Figure 7:
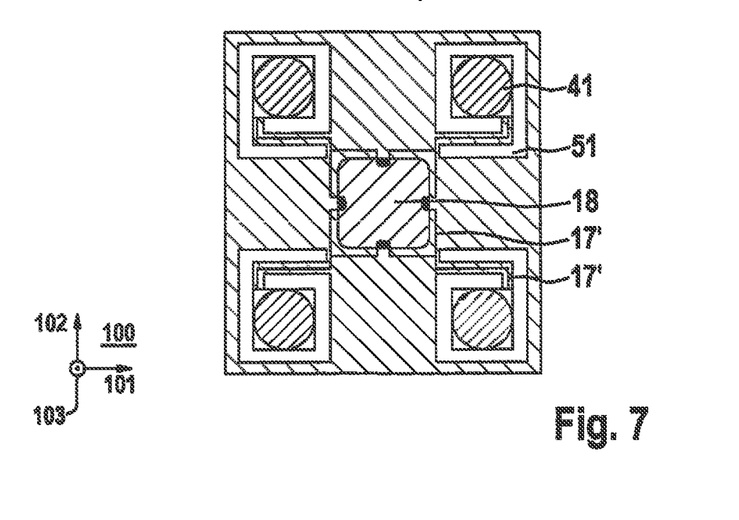

FIG. 7 shows a sensor unit 1 according to one specific embodiment of the present invention in a schematic top view, which essentially corresponds to the specific embodiments depicted in FIGS. 2 through 5, trench structure 51 here surrounding contact areas 41. This creates a spring-elastic connection between the first and second semiconductor components 10, 20 in contact areas 41, so that sensor structure 12 is decoupled.

Figure 8:
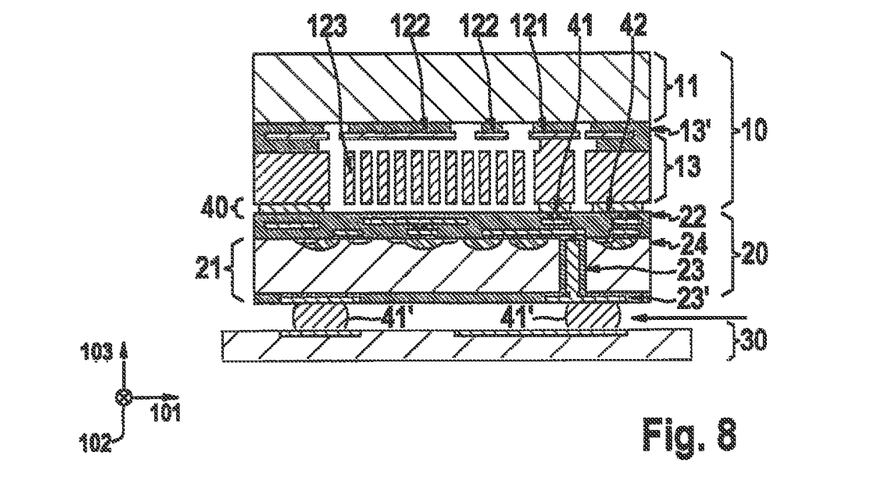

FIG. 8 shows a sensor unit 1 according to one specific embodiment of the present invention in a schematic side view. Sensor unit 1 includes a first semiconductor component 10 and a second semiconductor component 20. First semiconductor component 10 includes a first substrate 11 and a function layer 13, in particular, a polycrystalline silicon function layer. Function layer 13 includes a sensor element 123, in particular, a microelectromechanical sensor element 123 (MEMS sensor element or MEMS chip). Sensor element 123 is connected to first substrate 11, in particular, exclusively indirectly, via a suspension element 121. Furthermore, a further layer 13', having an electrode structure 122, which is configured, for example, for capacitive detection of a deflection of a movable structure of sensor element 123, is situated, in particular, between first substrate 11 and function layer 13. Second semiconductor component 20 includes a second substrate 21. First and second semiconductor components 10, 20, are connected to each other via a wafer connection 40. Wafer connection 40 includes a contact area 41 and a bond frame structure 42. Furthermore, second semiconductor component 20 is, in particular, electrically conductively connected to a third semiconductor component 30, for example, a circuit board, via further contact areas 41'. In particular, second semiconductor component 20 includes an evaluation structure 22, in particular, an integrated electronic circuit. Vias 23 for electrically conductive contacting of evaluation structure 22 preferably extend through second substrate 21 of second semiconductor component, here via further contact areas 41' and a contact element 23'.

First substrate 11 is a silicon substrate in particular and here has an oxide layer structure 13', and in particular, an electrode structure 122 situated in a strip conductor plane. A sensor element 123, for example, having a movable MEMS structure, for example, for acceleration sensors, rotation rate sensors, or magnetic sensors, is formed here from function layer 13. First semiconductor component 10 includes, in particular, further silicon function layers and oxide insulation layers, which are applied, for example, using wafer bonding processes and subsequent back grinding (not shown).

Second semiconductor component 20 includes in particular, a complementary metal oxide semiconductor (CMOS), which includes second substrate 21 having doped semiconductor layers 24 for implementing the electric circuits and a metal oxide stack having evaluation structure 22, in particular, for wiring and implementing capacitances. First and second semiconductor components 10, 20 are connected to each other, for example, with the aid of a metallic wafer bonding process, in particular, with the aid of eutectic bonding of aluminum with germanium. A topmost aluminum wiring level is used as a bonding surface, for example, on evaluation structure 22, and germanium is deposited on first semiconductor component 10 as the topmost layer. The two wafers are then pressed together at temperatures above 430° C. using sufficient pressure, so that a eutectic liquid phase is obtained. Wafer connection 40 then includes an aluminum-germanium bond, which, with the aid of a circumferential bond frame structure 42, causes sensor element 123 to be hermetically encapsulated and, in particular, an electrically conductive contact area 41 to be formed between first and second semiconductor components 10, 20. Other metallic bonding methods such as copper-zinc bonding or thermocompressive methods may be similarly used.

Figure 9:
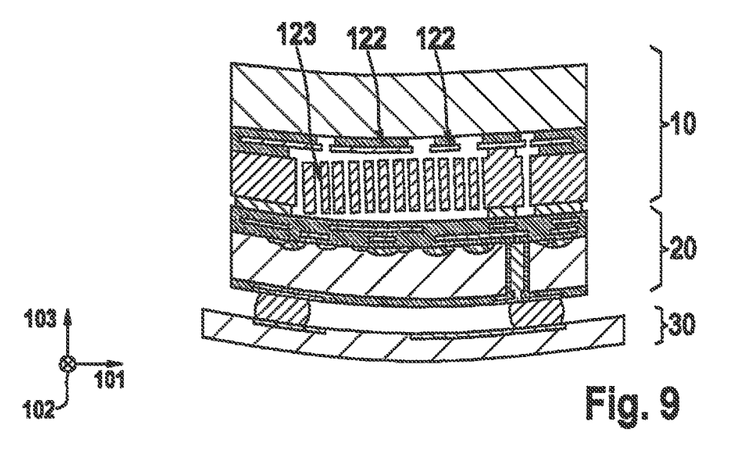

FIG. 9 shows a sensor unit 1, which has no decoupling structure 50, depicted distorted to illustrate a deflection or deformation of sensor unit 1, which may occur, for example, when first and second semiconductor components 10, 20 are pressed together for connecting to third semiconductor component 30. Sensor unit 1 is here deformed in the area of a cantilever MEMS element of sensor element 123 in a different way than in an area of electrode structure 122. In the case of a capacitive evaluation, the distance between a movable MEMS element and electrode structure 122 thus changes. Due to the decoupling structure according to the present invention, a drift, for example, of sensitivity, offset, and other detection variables, resulting from bending, is largely avoided by a decoupling of sensor structure 12 (see FIG. 10).

Figure 10:
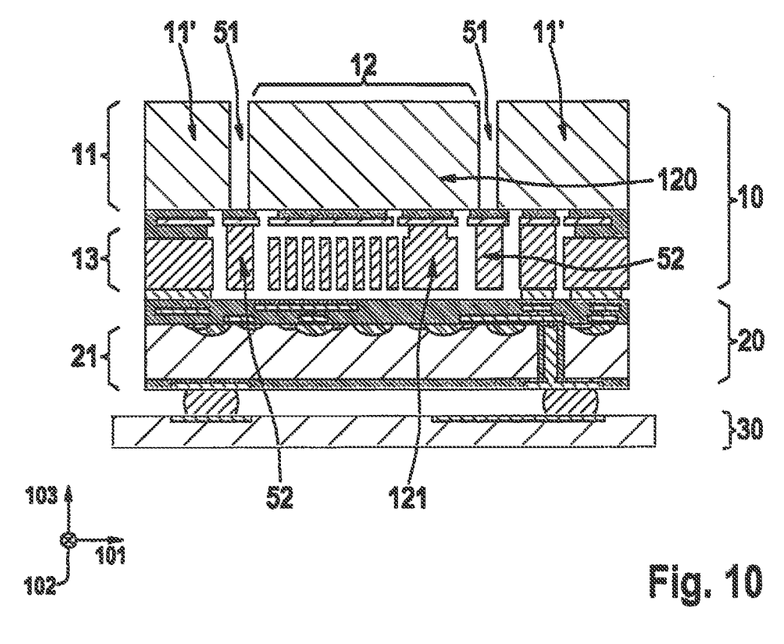

FIG. 10 shows a sensor unit 1 according to one specific embodiment of the present invention in a schematic top view, which essentially corresponds to the specific embodiments depicted in FIGS. 8 through 9. First substrate 11 here has a decoupling structure 50, decoupling structure 50 including a trench structure 51. Trench structure 51 here extends along a projection direction parallel to a normal direction 103 all the way through first substrate 11. In particular, the trench structure extends mainly along a plane parallel to the main extension plane 100. Here trench structure 51 has the shape of a circumferential rectangle or ring (see, for example, the top view depicted in FIG. 11). In particular, first semiconductor component 10 in function layer 13 includes coupling elements 52 for connecting sensor structure 12 to a mainland structure 11' of first substrate 11. Preferably a bending stiffness of first substrate 11 in the area of coupling elements 52 is reduced in relation to a bending stiffness of first substrate 11 in the area of mainland structure 11'. In particular, decoupling structure 50 is configured in such a way that a bending or deformation of sensor unit 1 imposed from the outside is largely absorbed and a structure element 120 of sensor structure 12 surrounded by trench structure 51 is essentially not bent, i.e., is decoupled. FIG. 12 shows such a bending as an example. In particular, an effect of mechanical and/or thermomechanical stresses both on the structure element and on sensor element 123, and thus on the entire sensor structure 12, including suspension element 121 and electrode structure 122 situated in the strip conductor plane, is reduced to such an extent that a detection with the aid of sensor unit 1 is not interfered with by external interferences or at least is interfered with much less than in the related art. Depending on the width of a circumferential trench of trench structure 51 and the width and/or height of coupling elements 52, a stiffness of the decoupling structure is adaptable or adjustable in a targeted manner.

Figure 11:
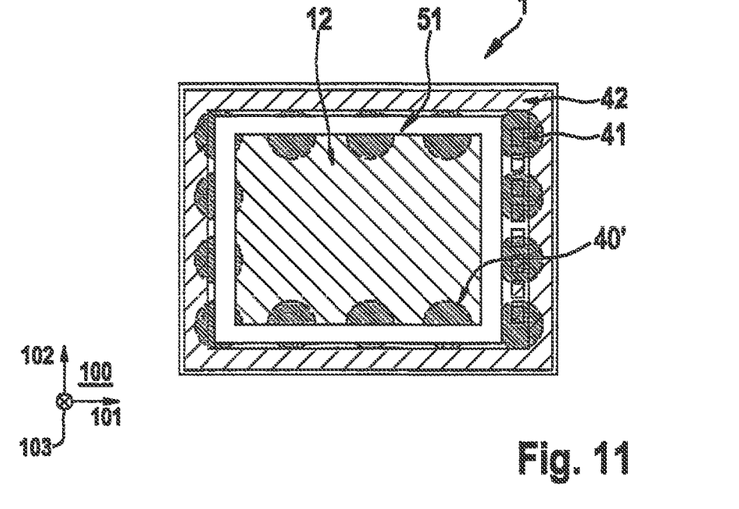
Figure 12:
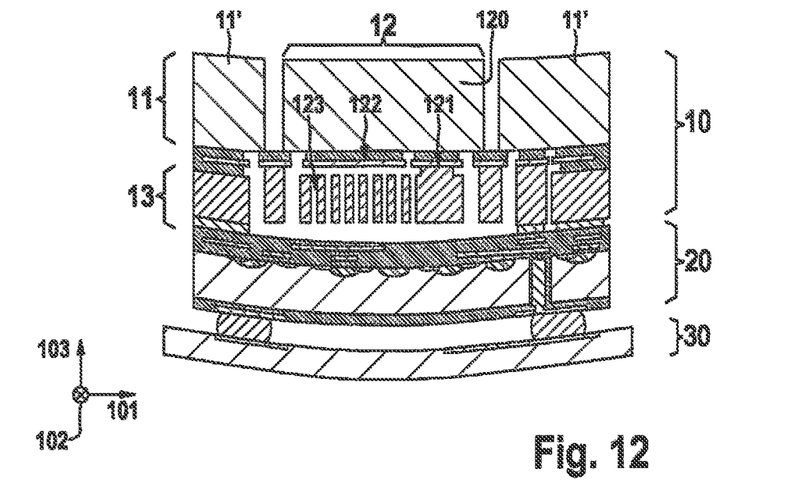

FIG. 11 shows a sensor unit 1 according to one specific embodiment of the present invention in a schematic top view. First substrate 11 here includes a sensor structure 12 in a circumferential trench structure 51 in a plane parallel to main extension plane 100. The trench structure is situated here within bond frame structure 42. In particular, bond frame structure 42 has a eutectic material. In particular, in the specific embodiment depicted here, trench structure 51 overlaps with one or several further contact areas 41' of component connection 40'.

Figure 13:
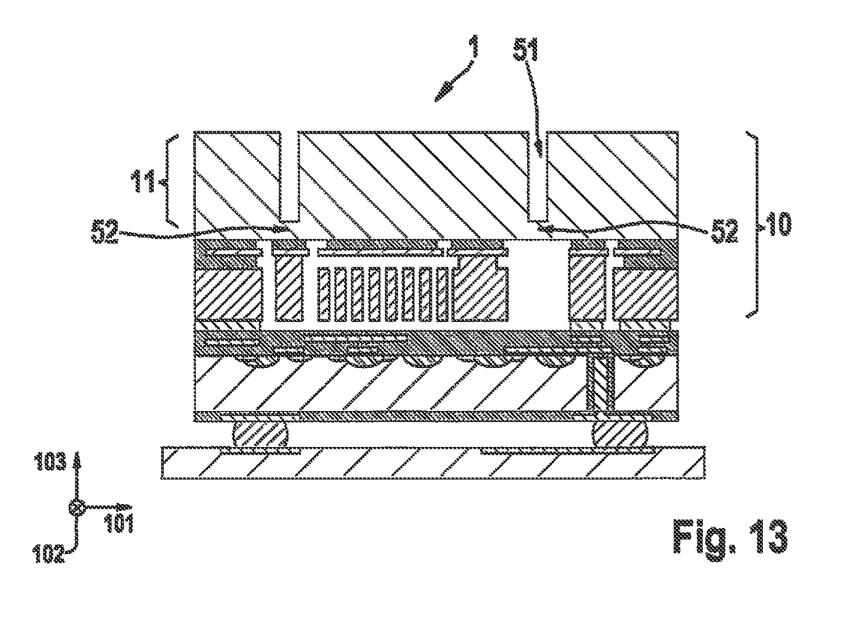

FIG. 13 depicts a sensor unit 1 according to one specific embodiment of the present invention. In the specific embodiment depicted in FIG. 13, trench structure 51 extends into first substrate 11 of first semiconductor component 10 along a projection direction parallel to normal direction 103, however, in particular, not all the way through first substrate 11. Preferably a trench depth of trench structure 51 extending parallel to normal direction 103 is between 60% and 100%, more preferably between 70% and 90%, and particularly preferably approximately 80% of a substrate thickness of first substrate 11 extending parallel to normal direction 103. In this case, coupling elements 52 extend exclusively in first substrate 11 i.e., no additional coupling elements are provided in a function layer in the specific embodiment shown here such as depicted, for example, in FIG. 10.

Figure 14:
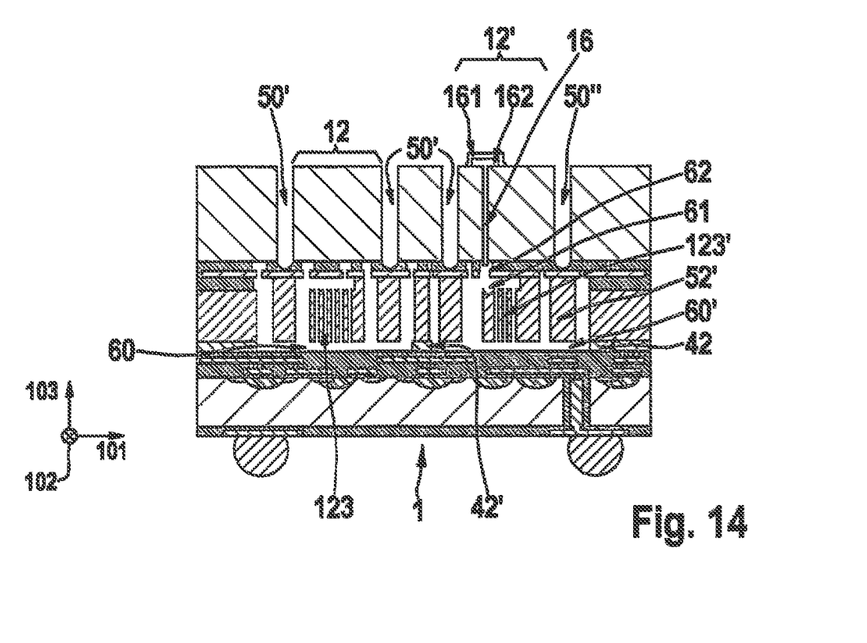

FIGS. 14 through 20 show sensor units 1 according to different specific embodiments of the present invention. FIG. 14 shows a sensor unit 1, first semiconductor component 10 here having a sensor structure 12 and a separate further sensor structure 12', decoupling structure 50 here including a partial structure 50' and a further partial structure 50", partial structure 50' being configured in such a way that sensor structure 12 is thermomechanically and/or mechanically decoupled from further semiconductor component 20, further partial structure 50" being configured in such a way that further sensor structure 12' is thermomechanically and/or mechanically decoupled from second semiconductor component 20.

Figure 15:
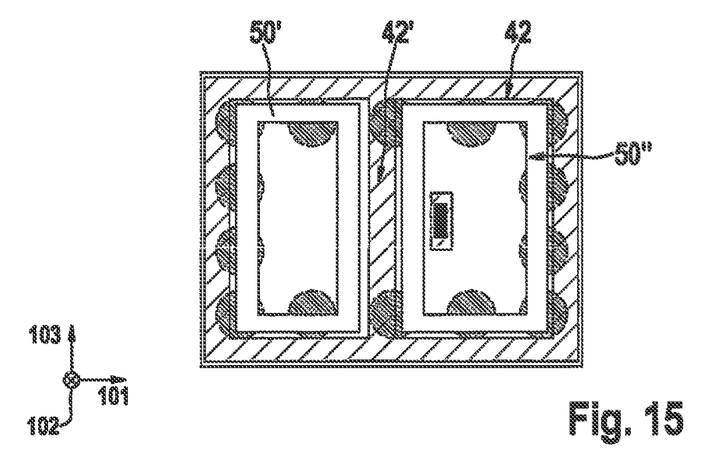

Furthermore, further sensor structure 12' includes, in particular, a further sensor element 123'. Sensor element 123 of sensor structure 12 and further sensor element 123' of further sensor structure 12' are here situated in two cavities 60, 60', hermetically separated from each other, sensor structure 12 being assigned to one cavity 60 and further sensor structure 12' being assigned to a further cavity 60' of the two cavities 60, 60'. For example, sensor structure 12 is configured for detecting accelerations and further sensor structure 12' is configured for detecting rotation rates. The hermetic separation of the two cavities 60, 60' is achieved here with the aid of a bond web 42' of bond frame structure 42 (FIG. 15).

In particular, the two cavities 60, 60' have different internal pressures, an internal pressure of further cavity 60' being adjusted with the aid of a reseal process. For this purpose, further cavity 60' has a venting hole 16 extending parallel to normal direction 103 through first substrate 11; this venting hole is sealed with the aid of a closure 162 in a finished sensor unit. In particular, a metal film 161 is placed on closure 162. Furthermore, the sensor unit has a first and a second through passage area 61, 62. In FIG. 15, the specific embodiment depicted in FIG. 14 is shown in a top view.

Figure 16:
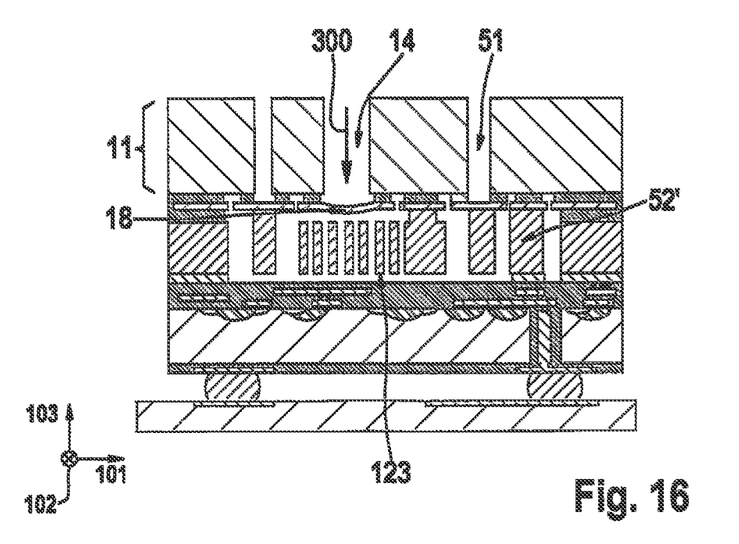

FIG. 16 shows a sensor unit 1 according to one specific embodiment of the present invention, which essentially corresponds to the specific embodiment depicted in FIG. 10. Sensor unit 1 is configured here as a pressure sensor unit and includes a pressure sensor channel 14. Pressure sensor channel 14 extends along a projection direction parallel to normal direction 103 through first substrate 11 to a diaphragm 18 of sensor structure 12.

Figure 17:
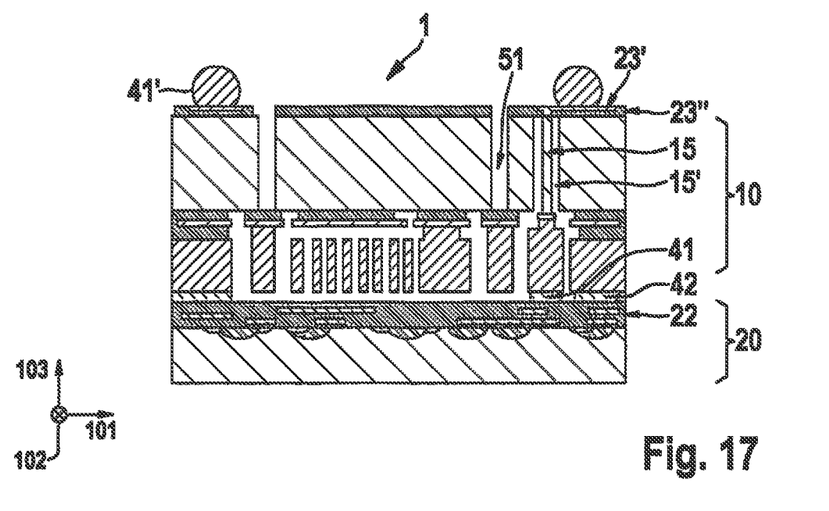
Figure 18:
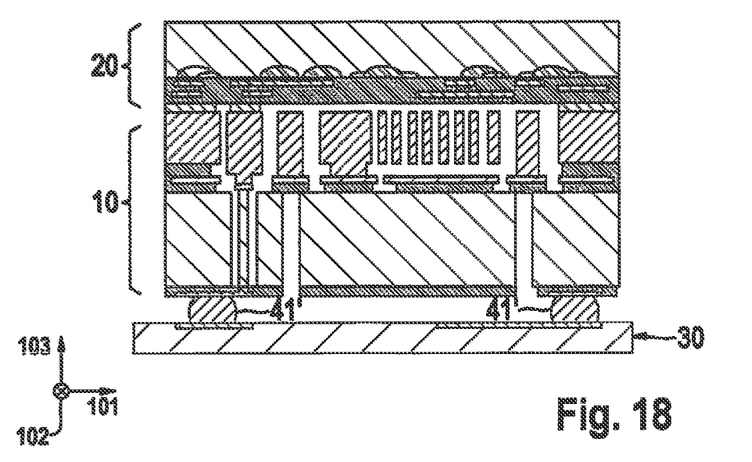

FIG. 17 shows a sensor unit 1 according to one specific embodiment of the present invention, which essentially corresponds to the specific embodiment depicted in FIG. 10. Here, first semiconductor component 10 has further contact area 41' for connecting to a third semiconductor component 30. Further contact area 41' is here connected to first substrate 11. Evaluation structure 22 is electrically conductively connected here to further contact area 41', in particular, via contact elements 23' situated over a layer 23", a via 15 situated in a via hole 15', and a contact area 41. Via hole 15' here extends through first substrate 11. FIG. 18 shows sensor unit 1 according to FIG. 17, sensor unit 1 here including first, second, and third semiconductor components 10, 20, 30. First semiconductor component 10 is electrically conductively connected to third semiconductor component 30 via further contact areas 41'.

Figure 19:
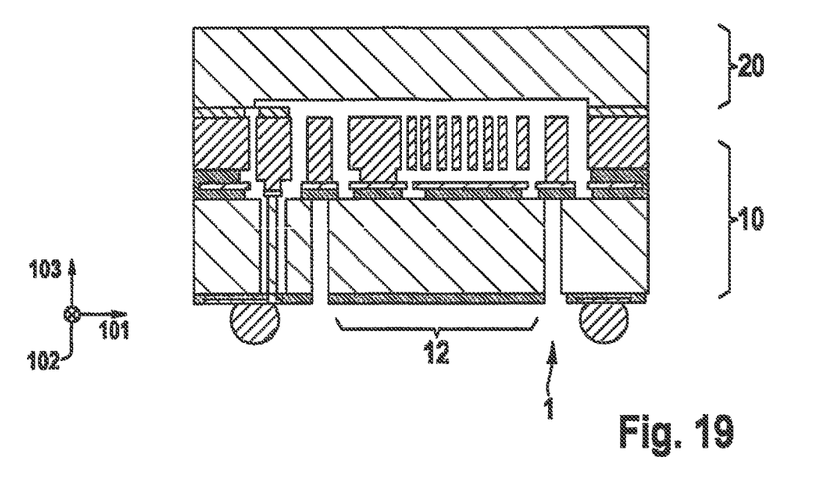

FIG. 19 shows a sensor unit 1 according to one specific embodiment of the present invention. The specific embodiment depicted here essentially corresponds to the other specific embodiments, second semiconductor component 20 being configured here as a cap or housing of sensor unit 1.

Figure 20:
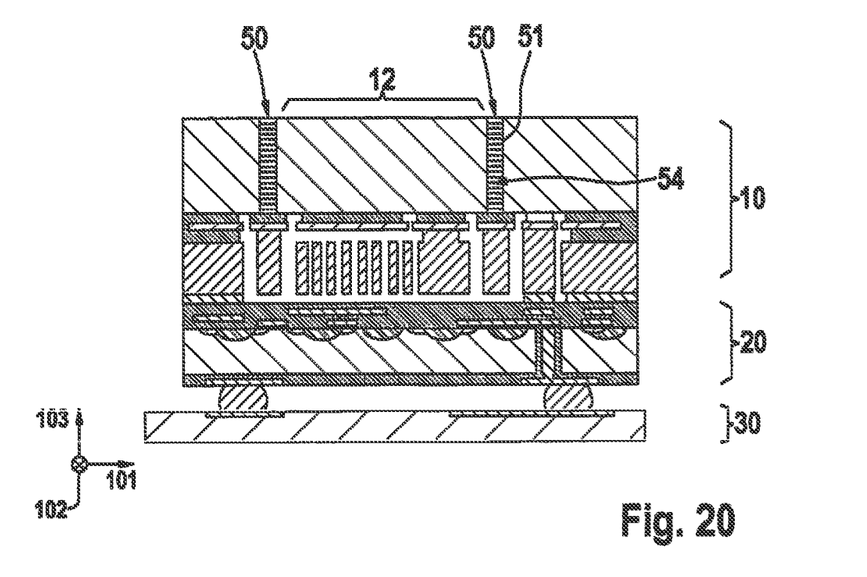

FIG. 20 shows a sensor unit 1 according to one specific embodiment of the present invention. The specific embodiment depicted here essentially corresponds to the other specific embodiments, trench structure 51 of decoupling structure 50 having a filling material here, filling material 54 being a polymer material in particular, filling material 54 having an elasticity modulus that is at least one order of magnitude smaller, i.e., being softer, than a substrate material, in particular, silicon material of first substrate 11.

Figure 21:
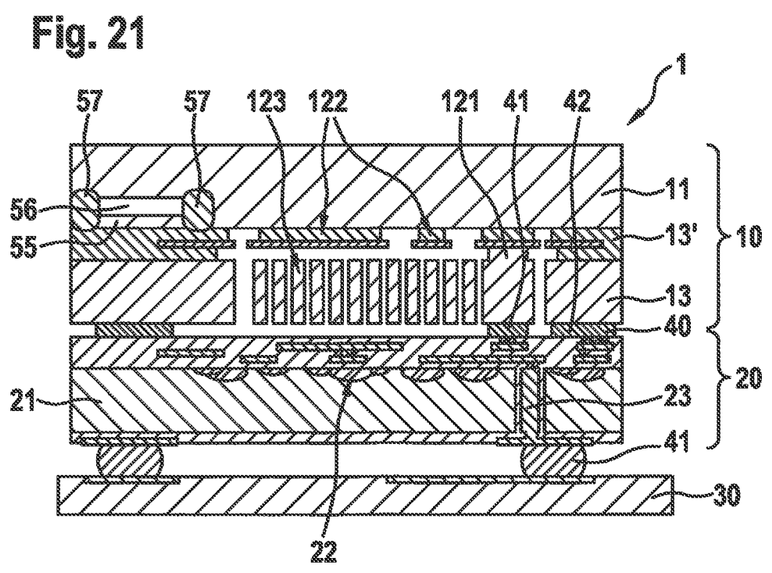

FIG. 21 shows a sensor unit 1 according to another specific embodiment of the present invention in a schematic side view. Sensor unit 1 includes a MEMS component 10 having a sensor structure and an ASIC component 20 including an evaluation circuit 22 for the sensor function of MEMS component 10.

In function layer 13 over substrate 11 of MEMS component 10, a deflectable sensor element 123 is formed, which is connected to MEMS substrate 11 via a suspension element 121. The deflections of sensor element 123 are detected capacitively with the aid of an electrode structure 122, which is formed in a further layer 13' between MEMS substrate 11 and function layer 13.

MEMS component 10 and ASIC component 20 are connected to each other via a wafer connection 40. Wafer connection 40 includes a contact area 41 for electrically contacting the MEMS sensor function and a bond frame structure 42.

The electrical signals of ASIC evaluation circuit 22 are sent to the back of ASIC component 20 with the aid of vias 23 in ASIC substrate 21, where the component is connected to a circuit board 30 via solder balls 41'.

Wafer connection 40 between MEMS component 10 and ASIC component 20 is, for example, a eutectic bond connection of aluminum with germanium. A topmost aluminum wiring level of ASIC component 20 may be used for this purpose as bonding surface, for example, and a germanium layer may be deposited on MEMS component 10. The two wafers are then pressed together at temperatures above 430° C. using a relatively high contact pressure, so that a eutectic liquid phase is obtained. In this way, a hermetically tight aluminum-germanium bond is created in the area of circumferential bond frame structure 42, so that sensor element 123 is hermetically capped. Other metallic bonding processes such as copper-zinc bonding or thermocompressive methods may be similarly used.

According to the present invention, the decoupling structure of the sensor unit depicted in FIG. 21 includes a diaphragm element 55, which spans a cavity 56 in the layer structure of MEMS component 10 and is formed over wafer connection 40, specifically over bond frame 42. This cavity 56 is created prior to the actual MEMS processing in MEMS substrate 11. In order to define the position, shape, and size of cavity 56, MEMS substrate 11 is initially provided with a doping 57, which is used for limiting an APSM process. Cavity 56 is then created using this process and diaphragm element 55 is exposed. Finally, the layer structure having the micromechanical sensor structure is then created on MEMS substrate 11 thus preprocessed.

With the aid of diaphragm element 55 and buried cavity 56, the contact pressure required for the wafer bonding process may be locally limited to the area of bond frame 42 in order to protect the sensitive circuit elements of ASIC component 20. This is achieved by the fact that diaphragm 55 is deflected by the contact pressure during the bonding process, until the restoring force equals the external force applied. A very good distribution of the contact pressure over the entire bonding area is thus achieved.

It should be noted here that the position and size of diaphragm element 55 and cavity 56 may also be selected in such a way that cavity 56 is opened on one side during the separation process, and thus an even more flexible overhang is obtained. However, cavity 56 may also be opened during structuring of MEMS component 10, for example, in a trenching process.

Figure 22:
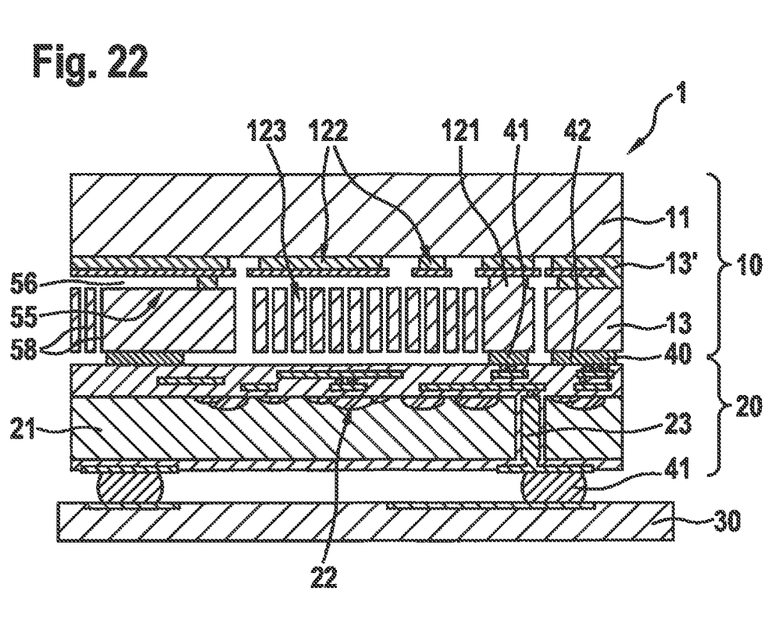

FIG. 22 shows an alternative option for implementing a diaphragm element 55, which spans a cavity 56 in the layer structure of MEMS component 10 and is formed in the area over wafer connection 40, specifically over bond frame 42.

Cavity 56 is located here between MEMS substrate 11 and function layer 13. It is created on MEMS substrate 11 in a sacrificial layer etching process in the layer structure and subsequently opened in a trenching process, in which pressure equalization openings 58 are created in function layer 13.

In the different figures, the same components are provided with the same reference numerals and are therefore, generally, named or mentioned only once.

What is claimed is:

1. A sensor unit, comprising:
a first semiconductor component, the first semiconductor component having a first substrate and a sensor structure; and
a second semiconductor component having a second substrate, the first and second semiconductor components being connected to each other via a wafer connection;
wherein the sensor unit includes a decoupling structure, which is configured so that the sensor structure is thermomechanically and/or mechanically decoupled from the second semiconductor component, and
wherein the decoupling structure includes at least one diaphragm element, which spans a cavity in a layer structure of the first semiconductor component and is formed in the area over the wafer connection.

2. The sensor unit of claim 1, wherein the decoupling structure has a trench structure, the trench structure extending along a normal direction perpendicular to the main extension plane of the first substrate, into the first substrate or all the way through the first substrate.

3. The sensor unit of claim 1, wherein the decoupling structure includes coupling elements for coupling the sensor structure to a mainland structure of the first substrate.

4. The sensor unit of claim 1, wherein the trench structure extends mainly parallel to the main extension plane of the first substrate, the trench structure surrounding the sensor structure.

5. The sensor unit of claim 4, wherein the cavity underneath the at least one diaphragm element is closed or has at least one pressure equalization opening.

6. The sensor unit of claim 3, wherein the sensor structure has a structure element surrounded by a first substrate and a sensor element surrounded by a function layer of the first semiconductor component, the sensor element being connected to the first substrate exclusively indirectly via the coupling elements.

7. The sensor unit of claim 1, wherein the sensor unit includes a cavity and/or a separate further cavity, the cavity and/or the further cavity being situated between the first and second semiconductor components, the wafer connection having a bond frame structure surrounding the cavity and/or the further cavity, the bond frame structure being configured so that the cavity and/or the separate further cavity is/are hermetically sealable or sealed.

8. The sensor unit of claim 1, wherein the sensor structure is a pressure sensor structure, a pressure sensor channel being situated in the first substrate, the pressure sensor channel extending into the sensor unit to a diaphragm of the pressure sensor structure.

9. The sensor unit of claim 1, wherein the sensor unit has a via formed in the first substrate for electrically contacting the sensor element of the sensor structure.

10. The sensor unit of claim 1, wherein the decoupling structure is a trench structure filled with a filling material, the filling material being a polymer material in particular, the filling material having an elasticity modulus that is at least one order of magnitude smaller than a substrate material.

11. A method for making a sensor unit, the method comprising:
providing a first semiconductor component including a first substrate and a sensor structure;
providing a second semiconductor component including a second substrate;
connecting the first and second semiconductor components to each other via a wafer connection to a sensor system;
forming a decoupling structure for thermomechanical and/or mechanical decoupling of the sensor structure from the second semiconductor component;
wherein the decoupling structure includes at least one diaphragm element, which spans a cavity in a layer structure of the first semiconductor component and is formed in the area over the wafer connection.

12. The method of claim 11, wherein in the forming, at least one of the decoupling structure, a pressure sensor channel, a via hole, a ventilation duct, and an insulation structure, are structured with the aid of a laser beam.

13. The method of claim 12, wherein in the forming, at least one of the decoupling structure, the pressure sensor channel, the via hole, the ventilation duct, and the insulation structure, are formed simultaneously in the first semiconductor component.

14. The method of claim 11, wherein in the forming, at least one of the decoupling structure, a pressure sensor channel, a via hole, a ventilation duct, and an insulation structure, are structured in particular in the first semiconductor component, in particular, in the first substrate with the aid of time-controlled etching, in particular, reactive ion deep etching, and/or with the aid of a laser beam.

15. The method of claim 12, wherein in the forming, at least one of the decoupling structure, the pressure sensor channel, the via hole, the ventilation duct, and the insulation structure, are formed simultaneously in the first semiconductor component, in particular, in the first substrate.

16. The sensor unit of claim 1, wherein the decoupling structure has a trench structure, the trench structure extending along a normal direction perpendicular to the main extension plane of the first substrate, into the first substrate or all the way through the first substrate.

17. The sensor unit of claim 1, wherein the trench structure extends mainly parallel to the main extension plane of the first substrate, the trench structure surrounding the sensor structure, in particular, the trench structure being meander-shaped or frame-shaped, in particular, ring-shaped.

18. The sensor unit of claim 1, wherein the sensor structure has a structure element surrounded by a first substrate and a sensor element surrounded by a function layer of the first semiconductor component, the sensor element being connected to the first substrate exclusively indirectly via coupling elements, the coupling elements being formed from the first substrate and/or from the function layer.

19. The sensor unit of claim 1, wherein the sensor unit includes a cavity and/or a separate further cavity, the cavity and/or the further cavity being situated between the first and second semiconductor components, the wafer connection having a bond frame structure surrounding the cavity and/or the further cavity, the bond frame structure being configured so that the cavity and/or the separate further cavity is/are hermetically sealable or sealed, in particular, a ventilation duct extending through the first substrate to the cavity or the further cavity.

20. The sensor unit of claim 1, wherein the sensor unit has a via formed in the first substrate, in particular, a silicon via, for electrically contacting the sensor element of the sensor structure.

21. The sensor unit of claim 1, wherein the decoupling structure is a trench structure filled with a filling material, the filling material being a polymer material in particular, the filling material having an elasticity modulus that is at least one order of magnitude smaller than a substrate material, in particular, silicon material of the first substrate.

22. The sensor unit of claim 1, wherein the at least one diaphragm element is made of porous silicon (porSi).

23. The method of claim 11, wherein the at least one diaphragm element is made of porous silicon (porSi).

24. The sensor unit of claim 1, wherein the at least one diaphragm element is formed in the first substrate.

25. The method of claim 11, wherein the at least one diaphragm element is formed in the first substrate.

26. The sensor unit of claim 1, wherein the sensor structure includes a pressure sensor diaphragm which is separate from the at least one diaphragm element.

27. The method unit of claim 11, wherein the sensor structure includes a pressure sensor diaphragm which is separate from the at least one diaphragm element.

28. The sensor unit of claim 1, wherein the sensor structure includes a plurality of layers, the sensor structure including a deflectable sensor element formed in a first one of the layers and an electrode structure for detecting deflections of the sensor element, the electrode structure being formed in a second one of the layers, and wherein the at least one diaphragm element is formed in the first one of the layers but spaced from deflectable sensor element.

29. The method unit of claim 11, wherein the sensor structure includes a plurality of layers, the sensor structure including a deflectable sensor element formed in a first one of the layers and an electrode structure for detecting deflections of the sensor element, the electrode structure being formed in a second one of the layers, and wherein the at least one diaphragm element is formed in the first one of the layers spaced from deflectable sensor element.

* * * * *